(12) United States Patent
Feld et al.

(10) Patent No.: US 7,053,640 B2
(45) Date of Patent: May 30, 2006

(54) SYSTEM AND METHOD FOR PROVIDING HIGH RF SIGNAL ISOLATION AND LOW COMMON GROUND INDUCTANCE IN AN RF CIRCUIT TESTING ENVIRONMENT

(75) Inventors: David A. Feld, Newark, CA (US); Daniel S. Lam, Santa Rosa, CA (US); Paul D. Bradley, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 102 days.

(21) Appl. No.: 10/331,714

(22) Filed: Dec. 27, 2002

(65) Prior Publication Data

US 2004/0124864 A1 Jul. 1, 2004

(51) Int. Cl.
*G01R 31/02* (2006.01)
*G01R 31/28* (2006.01)

(52) U.S. Cl. ...................................... 324/755; 324/765
(58) Field of Classification Search ................ 324/754, 324/755, 761, 765
See application file for complete search history.

(56) References Cited

U.S. PATENT DOCUMENTS

| | | | | |
|---|---|---|---|---|
| 4,138,643 A | * | 2/1979 | Beck et al. | 324/754 |
| 4,554,505 A | * | 11/1985 | Zachry | 324/755 |
| 4,740,746 A | * | 4/1988 | Pollock et al. | 324/761 |
| 4,851,764 A | * | 7/1989 | Usui | 324/755 |
| 5,004,977 A | * | 4/1991 | Kazama | 324/756 |
| 5,175,493 A | * | 12/1992 | Langgard | 324/761 |
| 5,942,906 A | * | 8/1999 | Stowers et al. | 324/761 |
| 6,028,436 A | * | 2/2000 | Akram et al. | 324/755 |
| 6,175,242 B1 | * | 1/2001 | Akram et al. | 324/755 |
| 6,203,329 B1 | | 3/2001 | Johnson et al. | |
| 6,275,054 B1 | * | 8/2001 | Boyle | 324/754 |

\* cited by examiner

*Primary Examiner*—Ernest Karlsen

(57) ABSTRACT

High port-to-port RF isolation for a test socket in a production RF test environment is achieved by establishing a coaxial-type connection between the test socket and the device under test (DUT). This coaxial-type connection results by at least partially surrounding each port of the DUT with a ground seal connected to RF ground connection. In one embodiment, the ground seal is a metallic base plate of the test socket which surrounds the RF connection to the DUT.

4 Claims, 10 Drawing Sheets

US 7,053,640 B2

SYSTEM AND METHOD FOR PROVIDING HIGH RF SIGNAL ISOLATION AND LOW COMMON GROUND INDUCTANCE IN AN RF CIRCUIT TESTING ENVIRONMENT

TECHNICAL FIELD

This invention relates to RF testing and more particularly to systems and methods for providing high RF isolation and low common ground inductance among the ports of a production test fixture.

BACKGROUND OF THE INVENTION

During any manufacturing process it is important to perform testing at various stages of construction, especially at final test. This is true for the testing of electronic circuit components that operate at RF frequencies.

As production volumes of RF circuits increase worldwide, the need for fast, efficient, and accurate testing procedures becomes more important. Mainstream electronic devices, such as cell phones, are operating at ever-higher frequency bands. The RF components which comprise these devices now routinely operate in the 2 GHz range, and they are beginning to operate in the 5 GHz range and higher. The difficulty of maintaining high RF isolation among the ports of a circuit component under test becomes more difficult at ever-higher frequency bands.

RF circuit components are typically tested with instruments such as a multiport network analyzer. However, in order to use such a test instrument to measure the electrical characteristics of a circuit component, a system is needed that electrically connects the input/output (I/O) ports of the test instrument to the I/O ports of the component. Typically this is done as follows: coaxial cables, such as SMA cables, are screwed into a set of connectors (the I/O ports) on the test instrument. The other ends of the cables screw into a set of connectors which mate the coaxial cable to a printed circuit board. The printed circuit board carries the electrical signals (I/O's) to a test socket which provides an interface between the printed circuit board and the circuit component or device under test (DUT). It is crucial that this system containing coaxial cables, connectors, pc board, test socket, and the DUT be capable of providing an accurate measurement of the DUT. To get an accurate measurement of the DUT it is important that there be high RF isolation amongst both the signal paths (I/O's) and the signal return paths (ground paths) that travel between the network analyzer and the DUT. After the signals travel through the coaxial cables and onto the DUT, a good ground seal in which a continuous metal shield surrounds the signal pins, is hard to maintain, especially in a high-volume measurement system. As a result electromagnetic crosstalk or poor RF isolation between the signals and the signal return paths prevents an accurate measurement of the DUT.

Inductive or capacative coupling between the signal paths can, in principle, be calibrated out so that the DUT can be accurately measured. However, as is commonly the case in a test setup, a poor seal between the coaxial outer shield and the DUT's ground plane induces an effective inductance known as common ground inductance in the signal return path (ground) which can not be calibrated out of the system.

An example of a high-volume test socket used in measuring the S-parameters of an RF duplexer DUT is shown in FIGS. 5A, 6, 7 and 8. FIG. 5A shows test-set 50 with test bed surface 51 connected to coaxial cables 501–503. FIG. 5B shows test socket 70 connected via co-planar stripline pc board 513. The co-planar stripline pc board configuration is used so that the pc board signal trace is surrounded on the top, bottom, left and right side by grounded metal pc board traces, thus isolating the pc board signal traces from each other and to first order, forming a ground shield around the signal path. One side of each stripline signal trace is routed to the pc board connector (to the SMA cable) and the other side is routed to its respective test socket port.

FIG. 5C shows a typical test measurement system designed to achieve high RF isolation between the cables connecting measurement instrument 52 and device under test 53 as well as achieving near zero common ground inductance between the outer ground shield of the coaxial cables and the metal ground case of the "DUT". Each signal (for example, signal 523a) should be electro-magnetically isolated from all other signals (for example, 523b, 523c). A coaxial cable, (such as coaxial cable 523a) with end connectors 521 which mate with connectors 520B, satisfies this condition in that a ground shield surrounds each signal trace 522a, 522b, 522c along the entire length from measurement instrument 52 to "DUT" 53. This test methodology is routinely applied in a low-volume manual test of a "DUT" in which the coaxial cables are screwed into the coaxial connectors on both the "DUT" and the measurement instrument.

In a production test environment, where the "DUT" is typically a planar part, it is difficult to achieve a proper seal between the outer coax and the ground plane of the "DUT". This poor seal can reduce the isolation between the ports and can thus reduce the measurement accuracy (for example, a measure with an accuracy of ±1 dB) of the "DUT" from being obtained.

FIG. 6 shows existing test socket 60 having relatively poor (approximately 50 dB) port-to-port 602, 603, 604 isolation. Contacts 62, 63, 64 are used to contact the RF ports of the DUT with the stripline co-planar signal traces. A pair of "ground" pins 62a on either side of the contacts 62, 63, and 64 provide a current return (ground) path between the DUT and the stripline pc board ground metal. Because these pins only partially surround the signal pin there is substantial common ground inductance in the return ground path. Furthermore, RF electromagnetic radiation can stray from the port (for example, port 62) and couple to one of the neighboring ports (for example, ports 63, 64). In other words, this type of test socket does not provide a good ground shield around signal pins 62, 63, 64. Test socket 60 is shown for use with 11 mm×5 mm circuits.

FIG. 7 shows existing test socket 70 with center ground block 71 which provides better, but still insufficient, port-to-port isolation in the range of approximately 65 dB isolation. The center ground block provides a lower inductance signal path to the pc board co-planar stripline ground, and hence a lower inductance return path for each of the three signals, than does the test socket configuration of FIG. 6. Also, groundblock 71, placed between signal traces 72, 73, 74, helps to isolate the signal traces from one another. However, because the signal pins at each port is not fully surrounded by a metal shield, stray RF radiation can still couple from each port to its neighbors. In addition, the fact that radiation can escape or leak at the ports means that there is a common ground inductance between the DUT and the shield at each port.

FIG. 8 shows traditional high-volume test socket 80 designed to test 3.0 mm×3.0 mm filters (in ceramic packages). Signal pins 82 and 83 make contact to the input/output ports of the DUT and connect them to the co-planar stripline signal traces on the pc board. The other pins 85 and center ground block 81 provide a low inductance return path for the signal currents and hence provide low common ground inductance between DUT and shield and are connected to the pc board ground.

In order to guarantee +/−0.8 dB of measurement accuracy, port-to-port isolation that is approximately 20 dB higher than the dynamic range of the DUT is required. For circuits with a high dynamic range, e.g. 54 dB of dynamic range, such as an RF duplexer, at least 74 dB of isolation is required for an accurate (approximately 1 dB) RF transmission measurement.

For small parts, such as a filter in a 3.0 mm×3.0 mm ceramic leadless chip carrier (LCC) package as discussed with respect to FIG. 8, where 35 dB of dynamic range is required, at least 55 dB of port-to-port isolation is required for 1 dB of accuracy. In state-of-the-art test sockets, with imperfect metal shields surrounding the signal traces near the ports, and with the ports so closely spaced (~3 mm), 55 dB of isolation is difficult to achieve. In this context the term "isolation" means that the electromagnetic cross-talk between any two test socket ports, in the desired frequency range, must be less than the specified value in all circumstances. For example, the isolation must be of the specified value when the test socket is empty, and when a metal short—that is a piece of metal that shorts all of the ports together—is placed inside the test socket.

BRIEF SUMMARY OF THE INVENTION

The present invention is directed to a system and method which provides high port-to-port RF isolation for enabling accurate RF transmission measurements of DUTs to be made in a production measurement system using test sockets for interfacing with the DUT. High test accuracy is achieved by designing the test socket to achieve a coaxial-type connection to the DUT without actually using connectors. A ground seal is constructed at each DUT input port and provides high port-to-port isolation, even as the DUTs become smaller and as the frequency bands over which these DUTs must operate increases.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the teachings of the present invention, reference is now made to the following descriptions of embodiments taken in conjunction with the accompanying drawing, in which.

DETAILED DESCRIPTION OF THE INVENTION

Figure 14A:
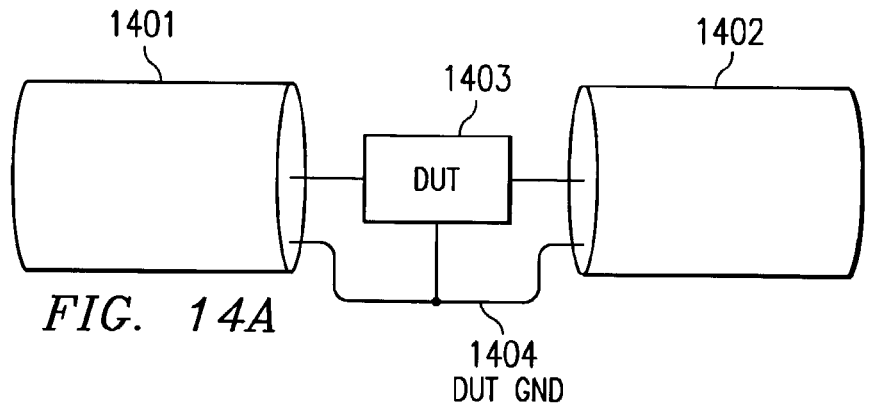
FIGS. 14A, 14B, 14C and FIGS. 15A, 15B, 15C illustrate examples of ideal and non-ideal grounding effects with respect to a DUT.
Figure 14B:
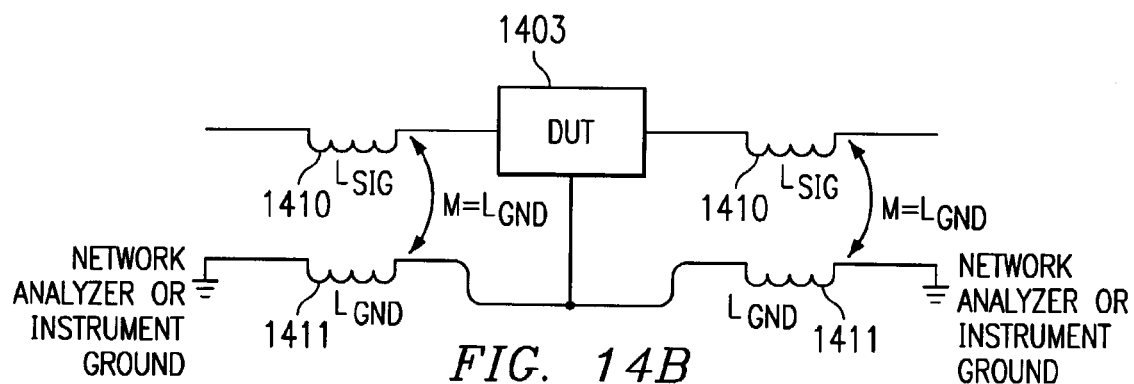
Figure 14C:
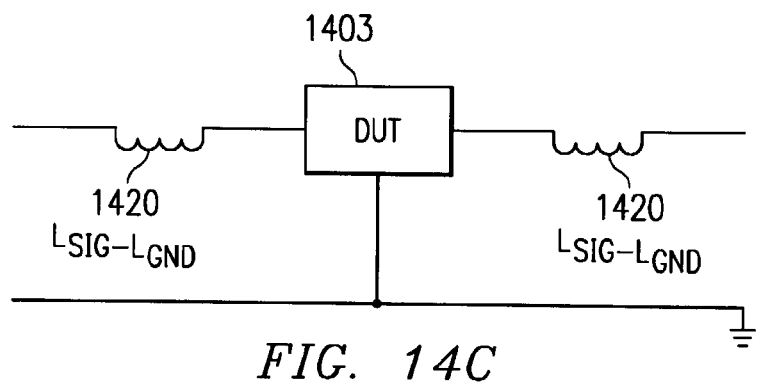

Before beginning a discussion of the embodiments of the invention, it maybe helpful to discuss FIGS. 14A, 14B, 14C, and 15A, 15B, and 15C. FIG. 14A, shows the ideal grounding case in which there is no common ground inductance. Here coaxial cable 1401, 1402 ground 1404 makes a perfect seal with DUT 1403. In FIG. 14B $L_{SIG}$ 1410 represents the inductance of the coaxial signal trace. $L_{GND}$ 1411 represents the inductance of the coaxial ground shield. Because the ground seal is perfect between the cable and the part, no magnetic flux can escape and hence the mutual inductance between the cable and the ground shield is equal to the inductance of the ground shield. Using this equality, the circuit schematic can be simplified to that shown in FIG. 14C where $L_{SIG}$–$L_{GND}$ is the effective circuit inductance. Note that DUT 1403 is perfectly grounded and can be correctly measured as a two port circuit.

Figure 15A:
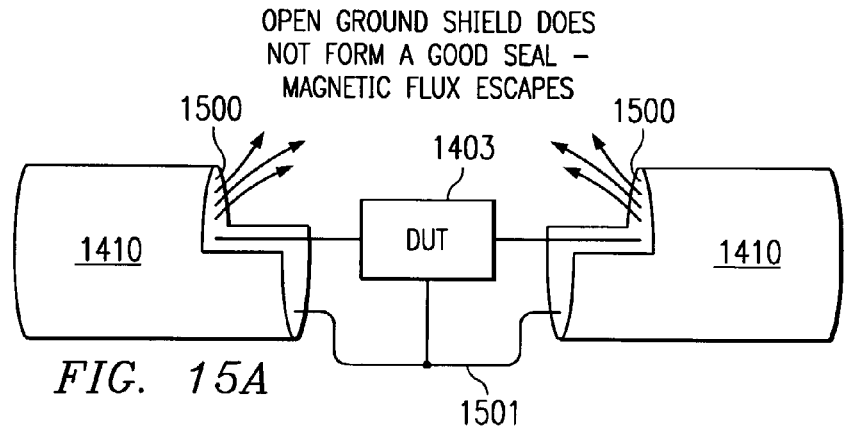
Figure 15B:
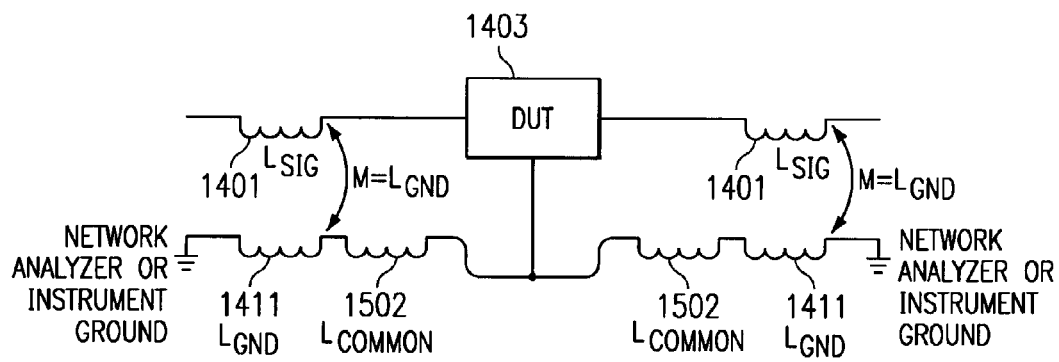
Figure 15C:
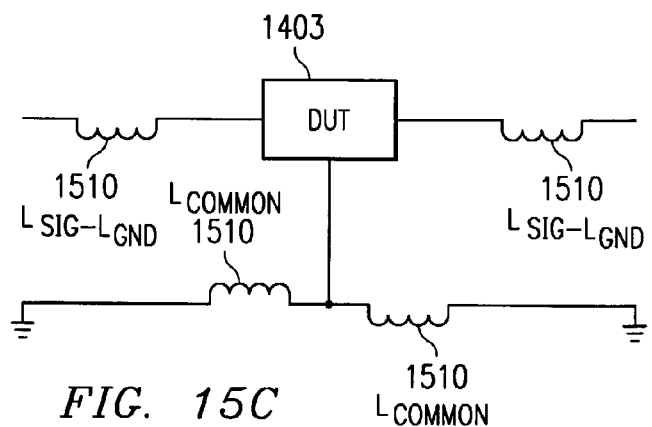

FIG. 15A shows what happens in the non-ideal case, where ground shield 1500 does not form a good seal with the DUT ground 1501 and thus allows magnetic flux to escape. In this case, there is an extra inductance 1502 in the ground return path of each coaxial cable as shown in FIG. 15B. The circuit can be simplified as shown in FIG. 15C. There is common ground inductance between DUT 1403's ground and the ground of the coaxial cable. This is problematic in that an accurate measurement of the DUT can not be made. The common ground inductance can not be calibrated out of the measurement system. In fact, the presence of this common ground inductance allows unwanted signal energy to flow from one port to the other and the measurement system will exhibit poor isolation between its ports. Another way to view this is that the current in each signal line and ground shield can be unequal. The common ground inductors allow some of the signal current in one of the coaxial lines to return through the ground shield of the other cable. This is a common source of measurement error and can only be corrected by ensuring that the interface between the DUT and the cables form a seal that encloses all of the magnetic flux.

Figure 1:
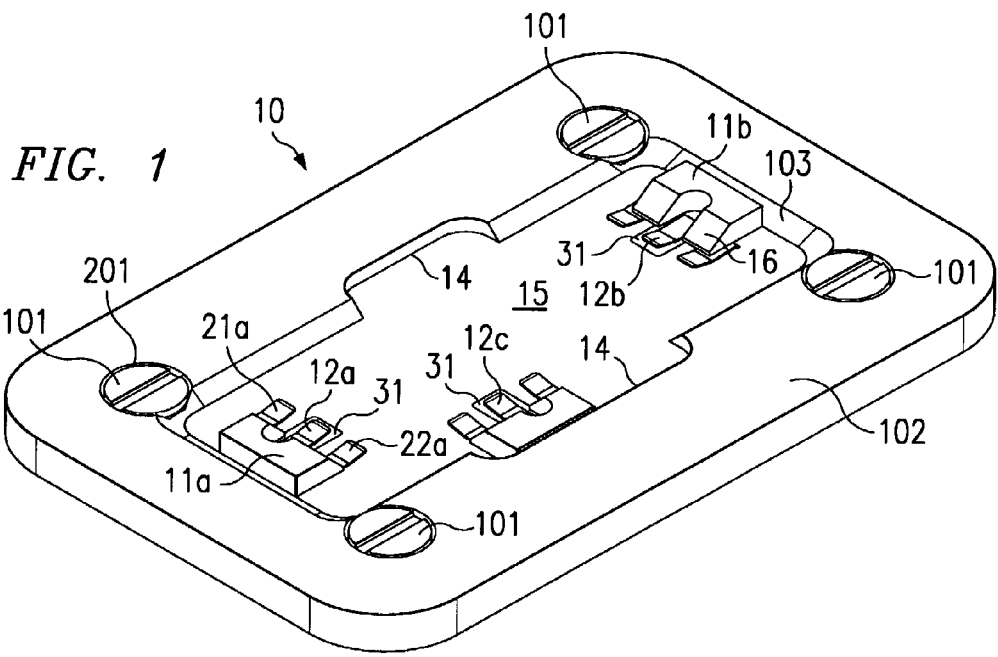
FIG. 1 is a perspective top view of the embodiment of a test socket showing the teachings of the invention.

Turning now to FIG. 1, there is shown a perspective view of one embodiment showing the teachings of the invention in which a coaxial-type test socket is constructed having high port-to-port isolation. When a transmission measurement (S12) is made between any two signal lines (such as 12a, 12b), a very tiny faction of the energy supplied into one signal line is received by the other signal line under the following conditions: A) when the test fixture is empty (open); B) when the test fixture contains a solid metal short; C) when the fixture contains 50-ohm load (assuming 50-ohm cabling) at the input to each port and D) under any condition in which a short, open or load is placed at one port and a short, open, or load is placed at the other port. It is important that when one speaks of, say 60 dB, of isolation that this amount of isolation be obtained under all such conditions, not just when the test fixture is open. Since a DUT can behave like a short, open or load at each port, the signal isolation must be maintained when the DUT presents any possible load condition. If high isolation measurements are obtained in each of the three aforementioned measurement conditions, then this indicates that the ports are both electrically and magnetically uncoupled from each other and they share very low common ground inductance.

Figure 2:
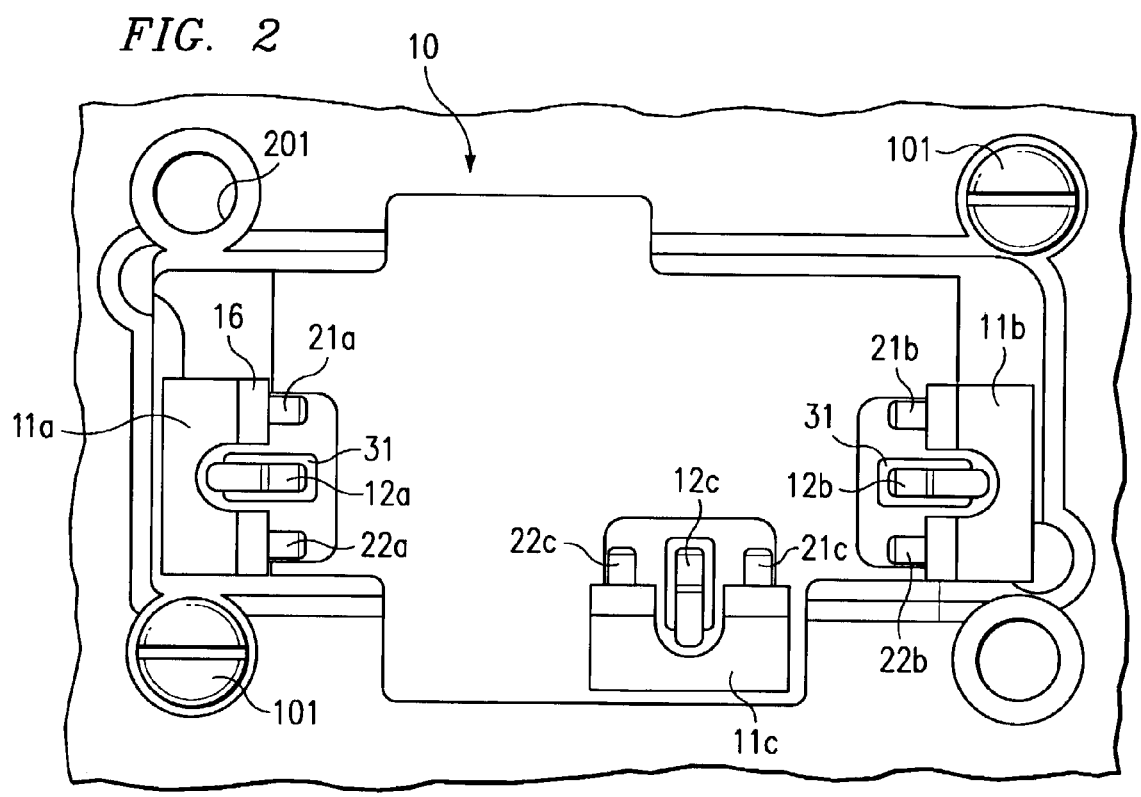
FIG. 2 shows a more detailed view of the test socket of FIG. 1.
Figure 4A:
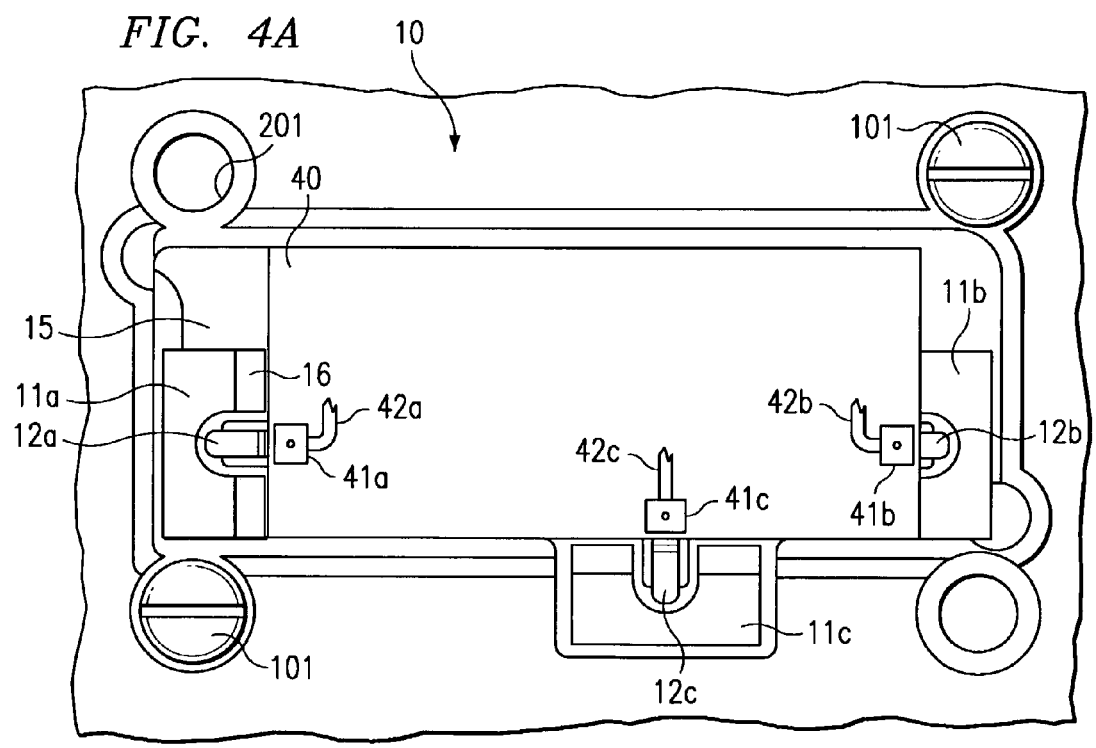
FIG. 4A shows the test socket of FIGS. 1 and 2 with a device under test (DUT) inserted therein.
Figure 5A:
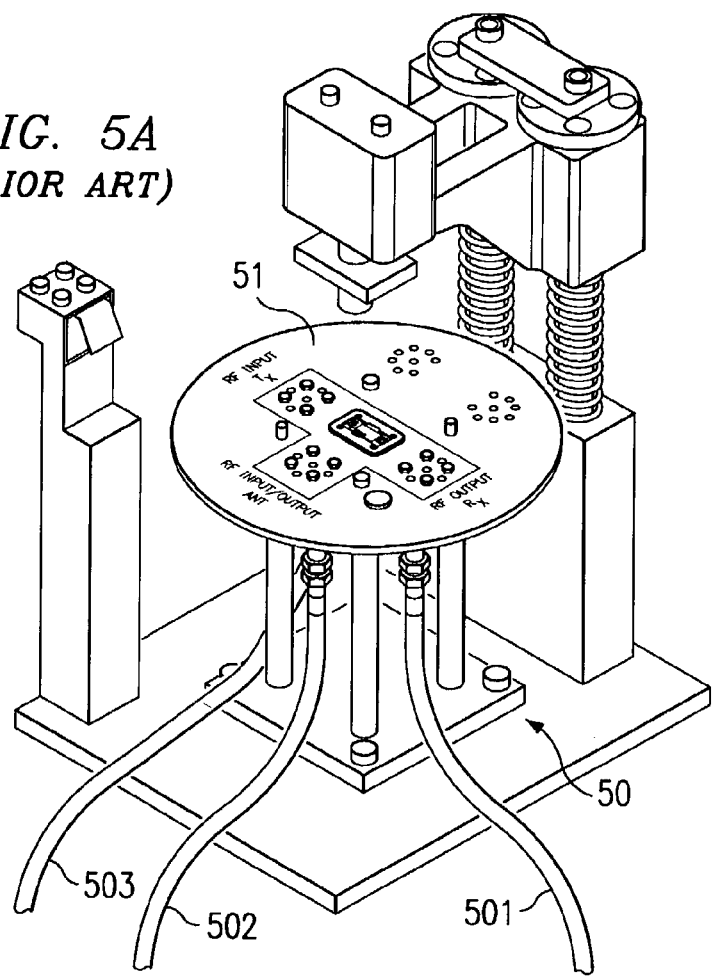
FIGS. 5A and 5B show a test set using a test socket of the prior art.
Figure 5B:
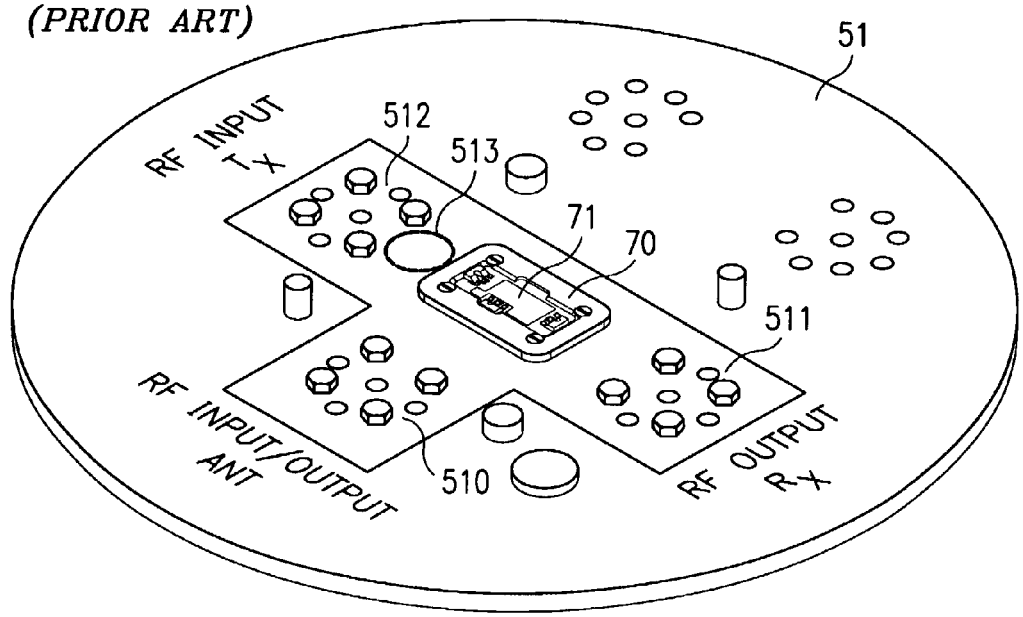
Figure 5C:
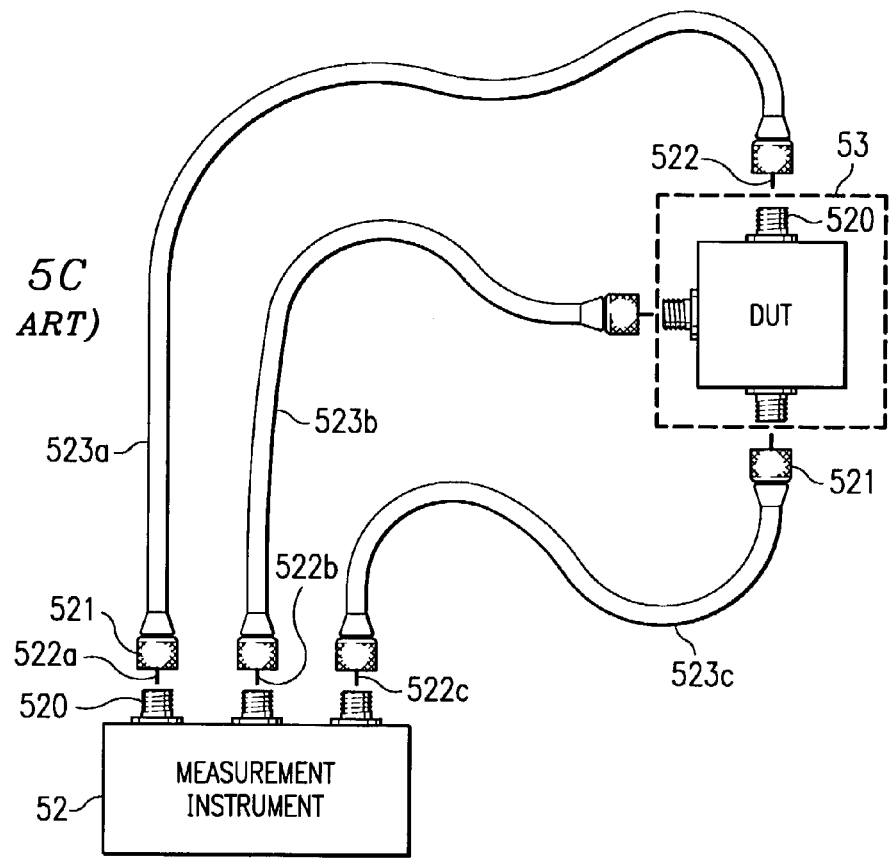
FIG. 5C shows a high isolation test method.
Figure 6:
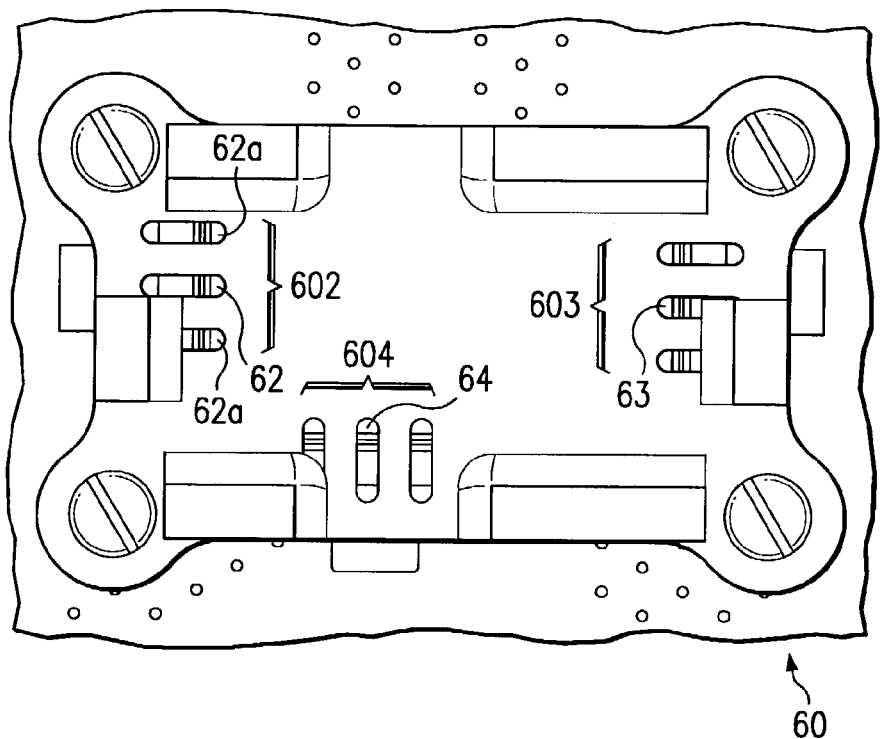
FIGS. 6, 7 and 8 show prior art test sockets.
Figure 7:
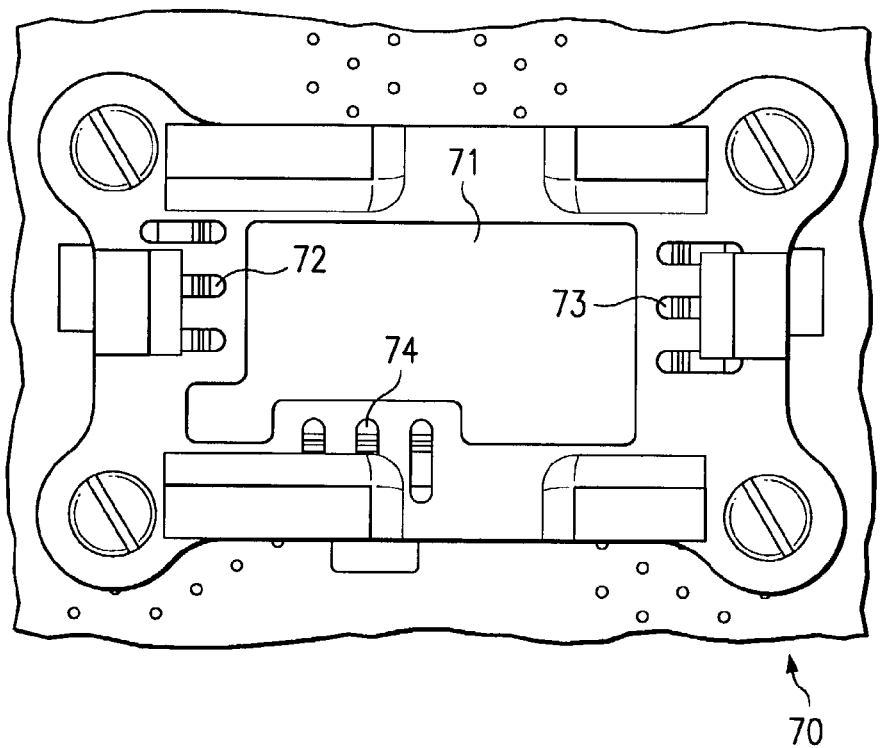

In the embodiment shown in FIG. 2, which is optimized for 11 mm×5 mm, the isolation is more than 80 dB. FIG. 1 shows test socket 10 which is connected to test bed 51 (FIG. 5B) by fastening device 101 inserted through holes 201 in frame 102. The device to be tested (one example of which is shown in FIG. 4A), is positioned in center section 15 and the RF ports of the test bed (in this example, three such ports) make contact with terminals 12a, 12b, 12c of test socket 10 from the bottom (shown in FIG. 3). Indentations 14 are primarily to aide in handling the DUT.

Test socket 10 has sides 102 built up above center section 15 to provide support and positioning for a circuit being tested. Sides 102 can be any material, such as torlon. Center section 15, which advantageously could be beryllium copper (BeCu) with gold over nickel plating, is used to provide a ground seal around each input port of the DUT. Slider contacts 12a, 12b, and 12c (if desired, comflex) are positioned within insulator 31, which advantageously can be torlon and serves to separate the RF ports from the grounded center section. Guide 11a, 11b, and 11c, which advantageously have sloping faces, which aide the insertion/retraction of a DUT can be made of torlon. These guides can act as RF barriers when the ports are not fully inside the ground plane, as will be discussed hereinafter. Slides 21a, 22a are connected to grounded center section 15, as will be shown in FIG. 3.

FIG. 2 shows test socket 10 in more detail. As shown in the example, test socket 10 is designed to accept three RF ports, such that slider 12a will contact the Tx input of the DUT, while sliders 12b and 12c will contact the Rx and Ant inputs of the DUT. Test socket 10 is designed for a DUT measuring 11 mm and contacts 21a, 22a, 21b, 22b, 21c, 22c are designed to insure RF ground with the DUT, as will be discussed.

Figure 3:
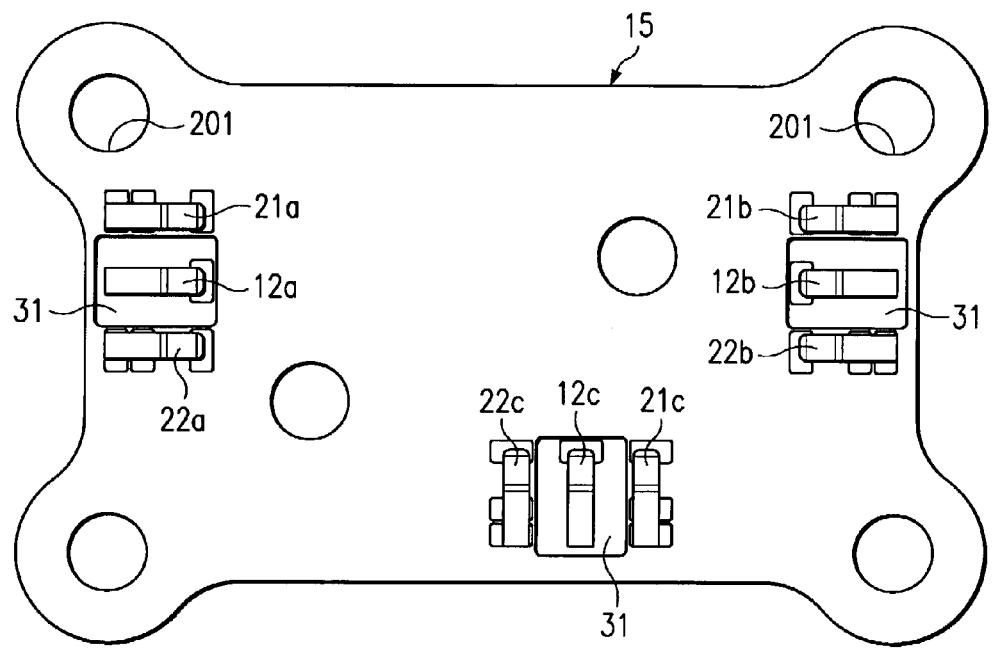
FIG. 3 shows a bottom view of the test socket of FIGS. 1 and 2.

FIG. 3 shows the bottom view of test socket 10. RF sliders 12a, 12b, 12c are held in place by inserts 31, which, as discussed above, can be made of torlon. The insert isolates the RF signal from ground plate 15. Ground sliders 21a, 21b, 21c, 22a, 22b, 22c are advantageously imbedded in metal, such as a BeCu block which then contacts the metal bottom surface of test socket 10. The bottom portion of RF slider contacts 12a, 12b, 12c are designed to mate with RF terminations on a test-bed, such as test-bed 51, discussed above with respect to FIGS. 5A and 5B. This then provides an RF signal which has a ground reference surrounding the RF signal all the way from the test set to the DUT.

Figure 10:
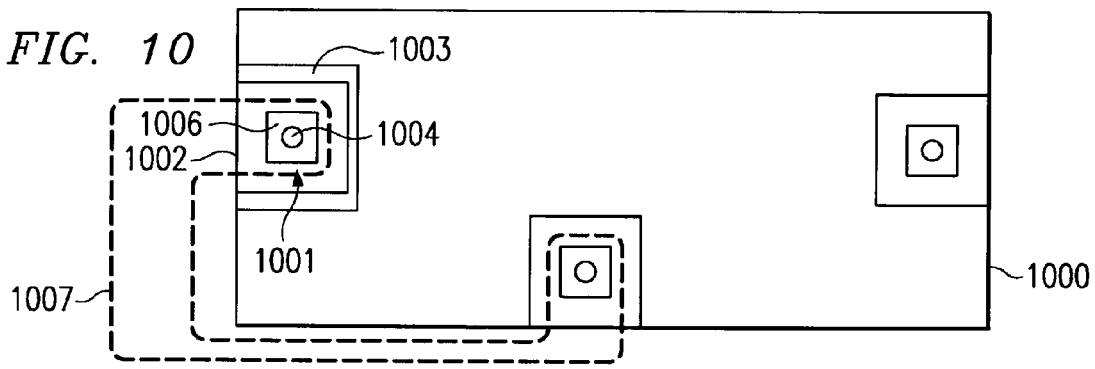
FIGS. 10 and 11 show the RF ports positioned on DUTs.
Figure 11:
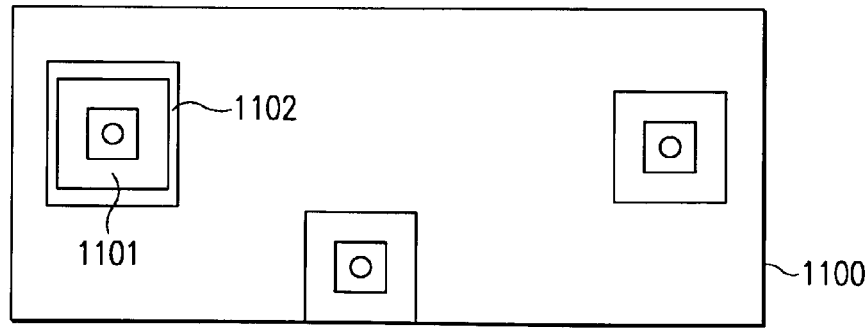

FIG. 4A shows DUT 40 (which, in the example is an RF duplexer) inserted into test socket 10. Contacts 41a, 41b, 41c of DUT 40 are on the back side of DUT 40 as shown in FIGS. 10 and 11 and the RF connection goes through VIA 1004 (FIG. 10) to the front side. The ground slides of test socket 10 mate with ground 1003 (FIG. 10) because ground contacts 21a, 22a, 21b, 22b, 21c, 22a mate with ground 1003, while sliders 12a, 12b, 12c contact portion 1006. Thus, the rear side of contacts 41a, 41b, 41c mate with slider contacts 12a, 12b, 12c, respectively, of test socket 10. Each of contacts 41a, 41b, 41c is shown connected to a portion of an RF lead 42a, 42b, 42c, respectively, leading from the contact. The remainder of the circuitry on DUT 40 is not shown for clarity.

For different DUT dimensions, or for different RF port layouts, center section 15 of test socket 10, along with the respective contacts 12a, 12b, 12c would be modified accordingly. Note that guides 11a, 11b, 11c provide a physical RF barrier at least partially around the RF port in situations where the terminal is at an edge (as shown in FIG. 10).

Figure 4B:
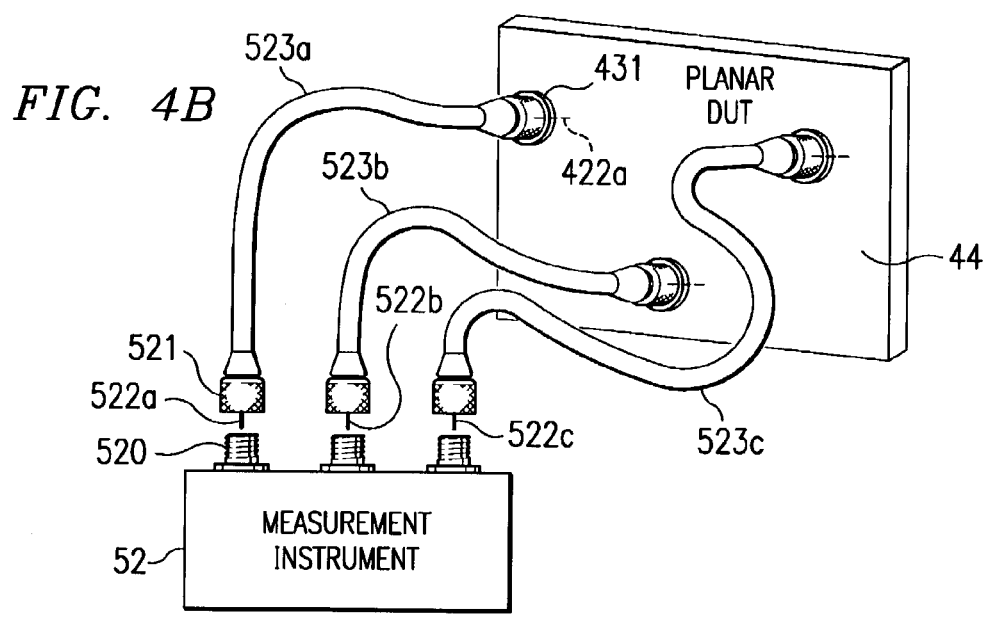
FIG. 4B shows an idealized illustration of FIG. 4A.

FIG. 4B shows an idealized version of DUT 44 being tested by instrument 52 where cables 523a, 523b and 523c are terminated using a coaxial type connectors 431. Test socket 10 is an approximation of this idealized test setup and is shown such that at each port a planar metal ground ring, such as ring 431, surrounds signal conductor 422a. This could be done by aligning signal pin 422a and cylindrical ground shield 431 to abut up against the signal pin (not shown) and the planar ring (not shown) surrounding the signal input port of the DUT respectively, thus forming a ground seal around the signal. FIG. 4B is neither a practical, nor reliable, way to make a shielded connection in production high volume test environments where millions of DUTs per month are tested.

Figure 9:
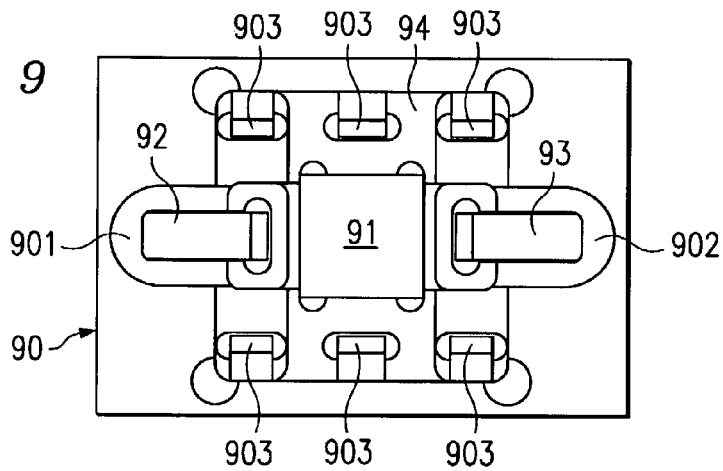
FIG. 9 shows an embodiment of a test socket in accordance with the teachings of the invention suitable for interfacing with smaller DUTs'

FIG. 9 shows one alternative embodiment 90 having compliant ground portion 91 surrounded by ground block 94, which is part of ground plane 90. This arrangement yields superior port-to-port isolation to that of prior art test socket 80 having ground portion 81 for 3.0 mm×3.0 mm DUTs. Slider 92, (93) is within torlon ring 901 (902) while ground sliders 903 are embedded into ground block 94.

FIG. 10 shows a DUT which has its RF inputs near the edge of the device. Because of this placement, test socket 10 does not make a perfect ground seal therewith. Nevertheless, the amount of stray radiation around and between the ports is kept to a minimum by designing the test socket bottom portion is (ground) to closely surround the signal pins. As shown in FIG. 10, DUT 1000 has at least one RF contact area 1001, surrounded on three sides by coax-type ground seal 1003. The RF signal line from the test instrument makes contact at location 1001. However, some radiation can escape via open side 1002, as shown by dotted lines 1007. The magnetic lines of force couple the ports together. This electromagnetic coupling between the ports exists because the ports are not sealed on one side. Additionally, the escaping magnetic field is a source of common ground inductance.

As shown in FIG. 10, via 1004 connects the I/O pad to the front side of the DUT. To improve the isolation, we want to shrink all three regions 1006, 1004, and torlon region 1002. The reason for this is that the smaller the hole, the closer the return ground will be to the signal line thereby minimizing the amount of electromagnetic flux which can escape should the seal between the test socket and the part be imperfect. Region 1006 is an insulator region signal pin 1001 and the surrounding ground. Such a force can be applied, for example, by a mechanical clamp or by a vacuum created within test socket 10. In this region the metal on the surface of the pc board has been etched away so that an insulator, such as GETEK material, is showing at the surface. There is a spacing between the signal pins and the ground, and is accomplished for the DUT by etching away a ring of surface metal on the pc board. On the test socket this is done by using the torlon inserts as discussed.

In theory, the DUT and the test socket could be designed in such a way that the coaxial ground is never broken when testing the DUT. A near perfect coaxial seal could be achieved by placing all ports of the part on the back side of and in the interior of the DUT. One example of such a design is illustrated in FIG. 11 for DUT 1100 where ground 1102 completely surrounds RF port 1101 and makes a complete ground seal around each terminal, thereby reducing magnetic lines of force 1007, shown in FIG. 10.

It should be noted that ground contacts 1003 (FIG. 10) and 1102 (FIG. 11) are flat and no different in composition, or height, from the rest of the metal ground plane shown. However, if desired, these regions could be raised or elevated, or a cylindrical compliant metal contact could be placed in these regions as an alternative to making a better ground seal. Such a contoured contact area (raised, lowered, sloped, etc.) could help prevent even a small gap from being present. Gaps could occur when two planar surfaces (the bottom of the DUT and surface 15 of test socket 10) are squeezed together. This is so since the surfaces are not truly flat and there will always be regions with small gaps between the surfaces. Even if there are small gaps the concepts taught herein will work, but it is important to have the metal surfaces surrounding the signal ports as close as possible to each other even if they are not touching each other at all points to form a perfect seal. One method of achieving minimum gaps is to use a high, uniformly distributed force between the DUT and the test socket.

Figure 12A:
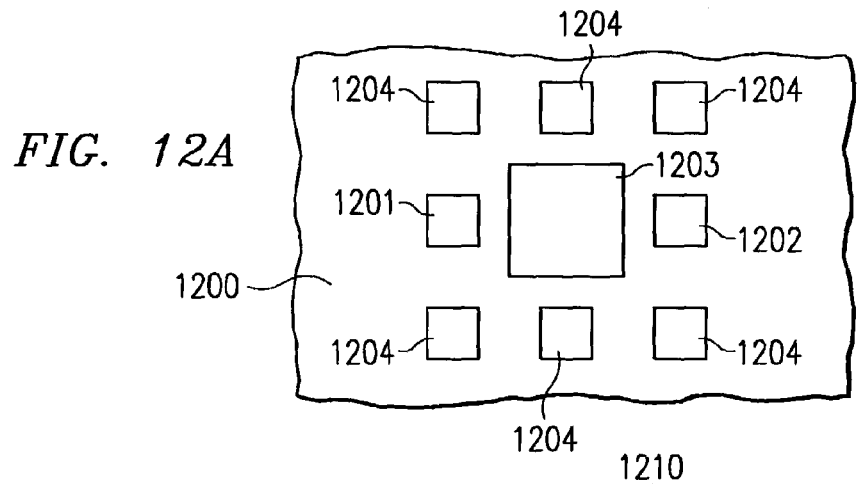
FIGS. 12A–12D show the testing and assembly process of an RF circuit.

FIGS. 12A–12D show the final stages of the manufacturing process. FIG. 12A shows the bottom side of DUT 1200 with two RF ports 1201, 1202 shown with center ground 1203 surrounded by ground ports 1204.

Figure 12B:
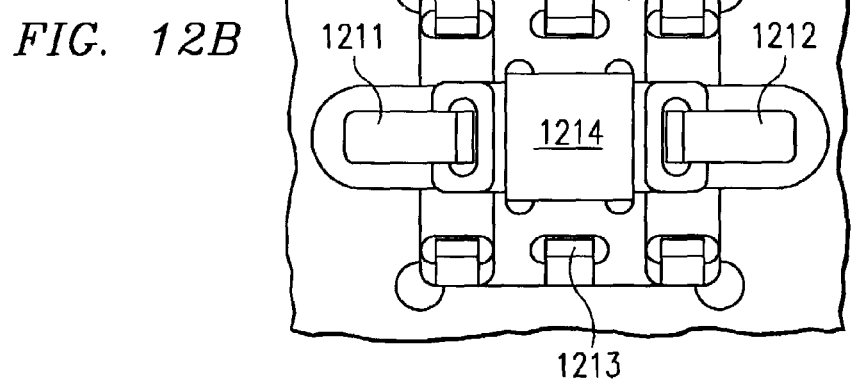

FIG. 12B shows contacter 1210 (similar to FIG. 9) with RF sliders 1211 and 1212 adapted for mating with ports 1201 and 1202, respectfully, as discussed above. Once DUT 1200 is placed in connector 1210, testing of DUT 1200 can begin.

Figure 12C:
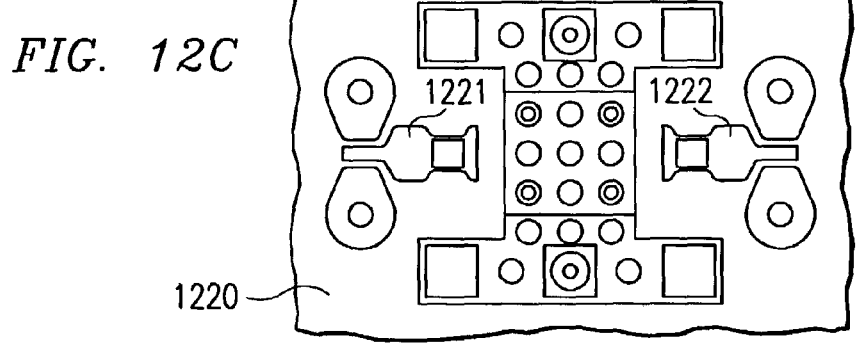

FIG. 12C is a printed circuit board into which DUT 1200 is to be soldered once it is successfully manufactured and tested. Solder pads 1221 and 1222 of board 1220 are designed to mate with pads 1201 and 1202 respectively.

Figure 12D:
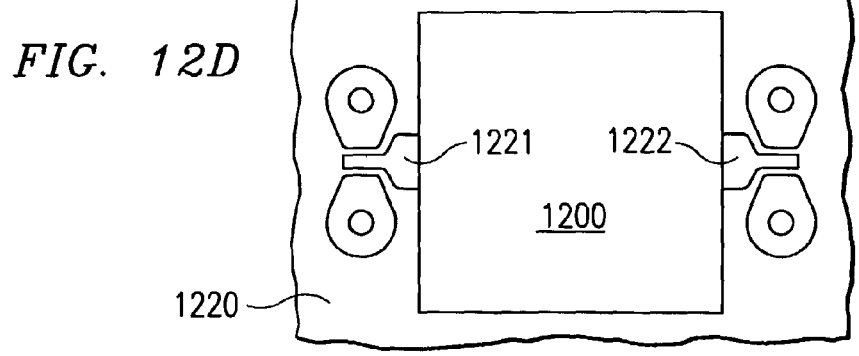

FIG. 12D shows DUT 1200 mated (soldered) onto printed circuit board 1320.

Figure 8:
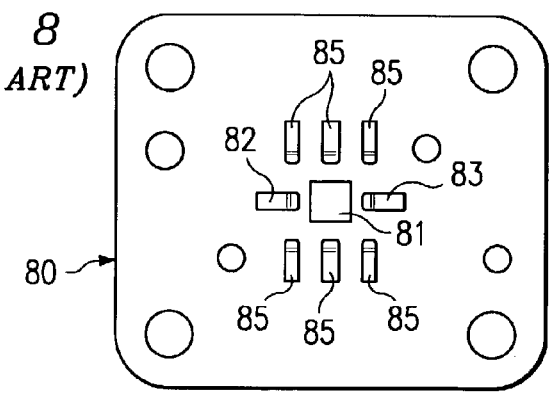
Figure 13A:
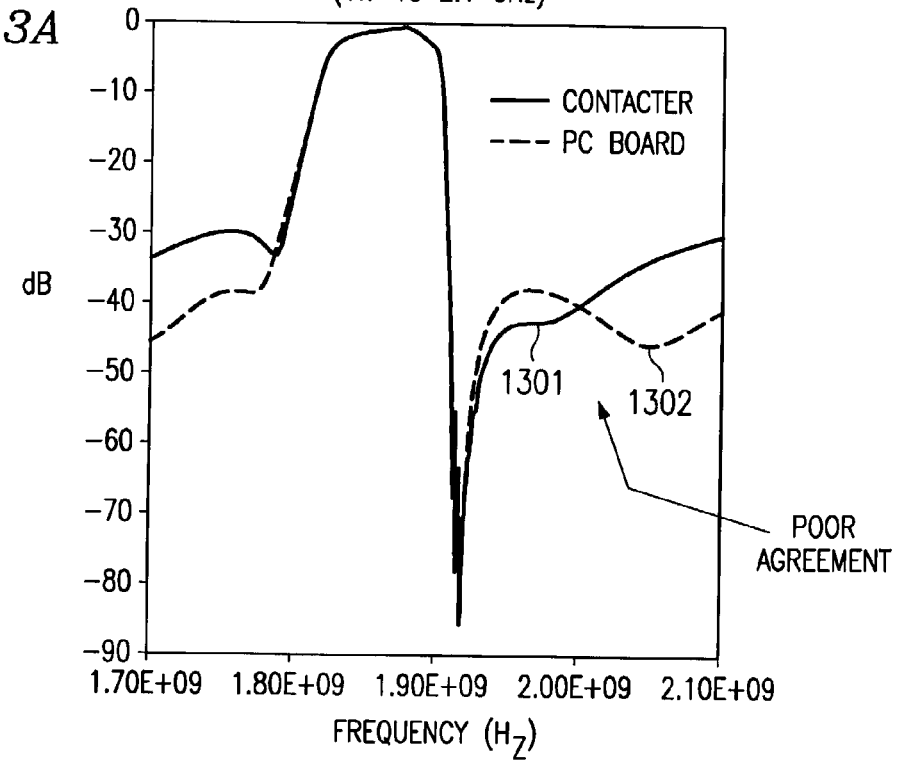
FIGS. 13A and 13B show graphs illustrating better performances using the test sockets in accordance with the teachings of the invention.

FIG. 13A shows a graph of the transmission measurement (S21, S212) for a filter circuit when the circuit is tested in a prior art test socket with ground block (FIG. 8) and then re-tested after it is soldered onto an Air coplanar (ACP) launch pc board. Trace 1301 represents the test measurement (S21) as performed by a prior art (FIG. 8) test socket. Trace 1302 represents the test measurement on the same circuit after it is soldered into the pc board. In theory, these two traces should be the same if the manufacturing testing using the test socket is to be a realistic representation of actual conditions during usage. Note that the two traces are not the same. At the upper frequency ranges the disagreement gets worse.

Figure 13B:
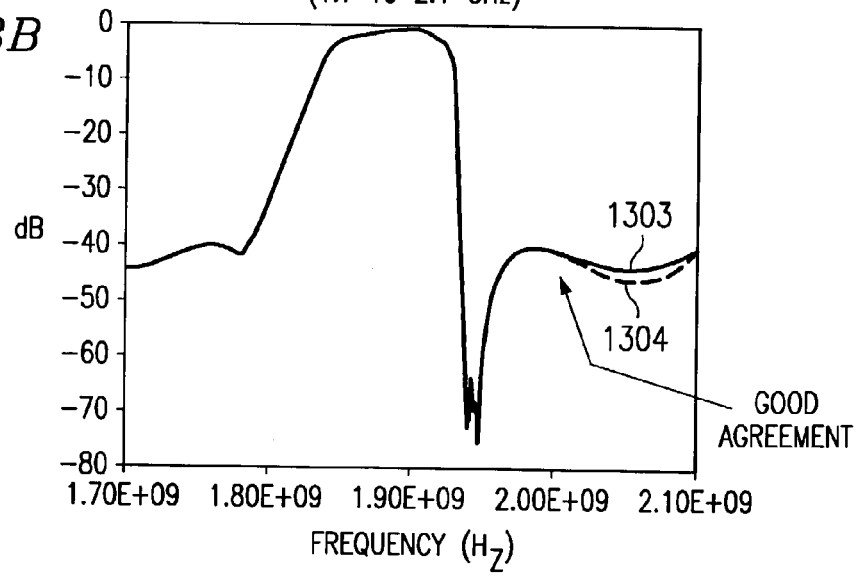

FIG. 13B shows the same measurements of a filter circuit measured first in the coaxial type connector (FIG. 12B) discussed herein and then soldered onto an ACP launch pc board. Note that trace 1303 (representing test socket testing) and trace 1304 (representing pc board testing) are in good measurement agreement with each other throughout the frequency range shown. Thus, the production test socket (trace 1303) constructed according to the concepts of the instant invention is a good predictor of the transmission characteristic of the circuit (trace 1304) when it is subsequently soldered into a pc board and retested.

As is typically done, a set of calibration standards, such as a (planar) short, open, load, and thus can be used to calibrate out non-idealities created by the (planar) fixture, pc board, and connectors. With this calibration applied, it will appear that each port is terminated in an ideal 50 ohms. Because of the method described herein ensuring that the signal lines have high isolation, the calibration, as well as the measurement of the DUT, will be more accurate.

Although the present invention and its advantages have been described in detail, it should be understood that various changes, substitutions and alterations can be made herein without departing from the spirit and scope of the invention as defined by the appended claims. For example, the concepts discussed do not require that the DUT be a planar DUT. For example, the DUT could be in a non-planar saddle shape and still have a good ground seal formed by designing the interface between the end of the coax and the part correctly.

Also, it should be noted, that the coaxial cable could be, for example, twin ax, where a differential signal pair exists inside the cable's ground shield and where a differential connection is made to the DUT. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A test socket for RF testing, said test socket comprising:
   a cavity;
   said cavity having an opening for receiving therein a circuit to be tested;
   said cavity having a support surface for physically supporting a circuit received into said opening;
   said cavity further comprising at least one contact for communicating RF signals between a test source and an RF port on said received circuit; and
   said support surface providing an RF shield around said at least on contact.

2. The test socket of claim 1 wherein said support surface forms a coaxial-type ground connection between said contact and said received circuit.

3. The test socket of claim 2 wherein said at least one contact comprises a plurality of said contacts, and wherein said support surface provides RF shield around each of said plurality of contacts.

4. The test socket of claim 2 wherein said at least one contact is disposed co-plannar with said support surface.

* * * * *

UNITED STATES PATENT AND TRADEMARK OFFICE
CERTIFICATE OF CORRECTION

| | |
|---|---|
| PATENT NO. | : 7,053,640 B2 |
| APPLICATION NO. | : 10/331714 |
| DATED | : May 30, 2006 |
| INVENTOR(S) | : Feld et al. |

It is certified that error appears in the above-identified patent and that said Letters Patent is hereby corrected as shown below:

column 8, line 64, in Claim 1, delete "on" and insert -- one --, therefor.

column 10, line 2, in Claim 4, delete "co-plannar" and insert -- co-planar --, therefor.

Signed and Sealed this

Nineteenth Day of September, 2006

JON W. DUDAS
*Director of the United States Patent and Trademark Office*